United States Patent
Chen et al.

(10) Patent No.: US 8,430,462 B2
(45) Date of Patent: Apr. 30, 2013

(54) SERVER RACK

(75) Inventors: Chin-Hui Chen, Tu-Cheng (TW); Wen-Hung Huang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 155 days.

(21) Appl. No.: 13/044,554

(22) Filed: Mar. 10, 2011

(65) Prior Publication Data

US 2012/0126673 A1 May 24, 2012

(30) Foreign Application Priority Data

Nov. 22, 2010 (TW) .............................. 99140262 A

(51) Int. Cl.
A47B 97/00 (2006.01)

(52) U.S. Cl.
USPC ....................................................... 312/223.2

(58) Field of Classification Search .................... 312/31, 312/31.01, 36, 236, 223.2; 211/26, 192; 361/679.46, 679.49, 692, 831, 678, 679.5, 361/679.51

See application file for complete search history.

(56) References Cited

U.S. PATENT DOCUMENTS

| | | | | |
|---|---|---|---|---|
| 5,171,183 A | * | 12/1992 | Pollard et al. ................. | 454/184 |
| 6,067,223 A | * | 5/2000 | Diebel et al. .................. | 361/676 |
| 6,149,254 A | * | 11/2000 | Bretschneider et al. ... | 312/223.1 |
| 6,151,210 A | * | 11/2000 | Cercioglu et al. ............. | 361/690 |
| 6,151,212 A | * | 11/2000 | Schwenk et al. .............. | 361/695 |
| 6,373,695 B1 | * | 4/2002 | Cheng ....................... | 361/679.39 |
| 6,376,805 B2 | * | 4/2002 | Faries et al. .................... | 219/400 |
| 6,542,362 B2 | * | 4/2003 | Lajara et al. ............. | 361/679.48 |
| 7,408,772 B2 | * | 8/2008 | Grady et al. ............. | 361/679.48 |
| 8,144,464 B2 | * | 3/2012 | VanDerVeen et al. ........ | 361/692 |
| 2010/0103606 A1 | * | 4/2010 | Olesiewicz et al. ...... | 361/679.33 |

* cited by examiner

*Primary Examiner* — James O Hansen
*Assistant Examiner* — Matthew Ing
(74) *Attorney, Agent, or Firm* — Altis Law Group, Inc.

(57) ABSTRACT

A server rack includes a main body, a pair of rails, and a pair of air guiding members. The main body includes two opposite sidewalls, each of which include a first flange defining a number of first through holes and define an air hole. The rails define a channel communicating with the air holes in the main body. Each air guiding member covers the corresponding air hole and includes a second flange that contacts corresponding first flange and defines a number of second through holes. A portion of the second though holes in each second flange and the corresponding first through holes are inserted by fasteners and the other second through holes and the corresponding first through holes without the fasteners inserted are reserved for directing cooling air to the channel via the air guiding members and the air holes.

9 Claims, 2 Drawing Sheets

SERVER RACK

BACKGROUND

1. Technical Field

The present disclosure relates to server racks and, particularly, to a server rack with good heat dissipation efficiency.

2. Description of Related Art

Computer servers typically include a server rack, a number of server modules, and a switch. The server rack defines an inlet and an outlet. Each of the server modules and the switch has a front panel. When the server modules and the switch are received in the server rack, the front panels of the server modules and the switch are located in the inlet. The front panel of each server module defines a number of dissipation slots. Cooling air can be directed through the server modules via the dissipation slots and the outlet for heat dissipation. However, the front panel of the switch is typically reserved for setting network interfaces, having no room for setting dissipation slots. As a result, the cooling air cannot efficiently enter into the switch and therefore heat dissipation efficiency of the switch is often less than satisfactory.

Therefore, it is desirable to provide a server rack, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
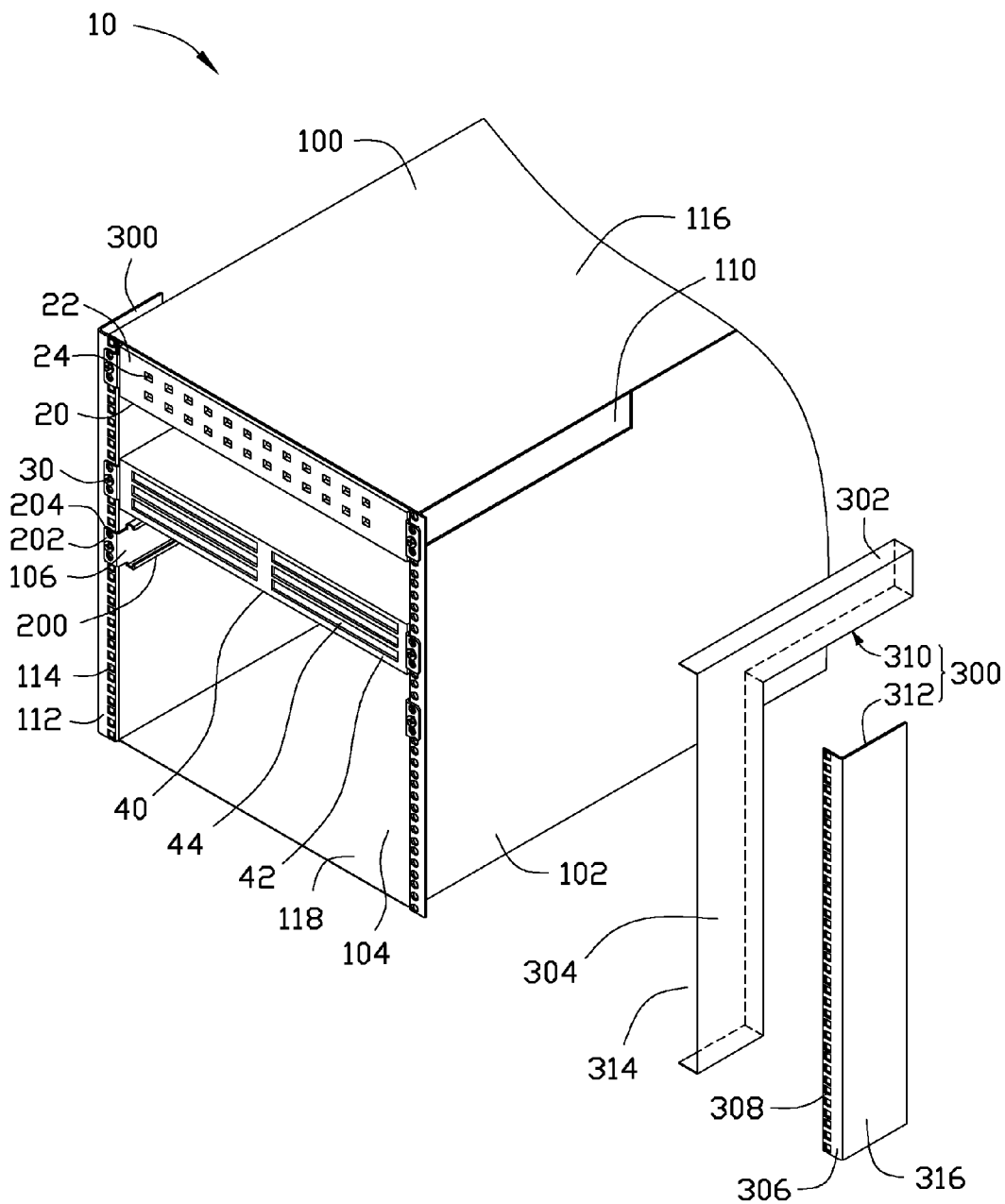
FIG. 1 is an isometric, exploded, and schematic view of a server rack, according to an embodiment.
Figure 2:
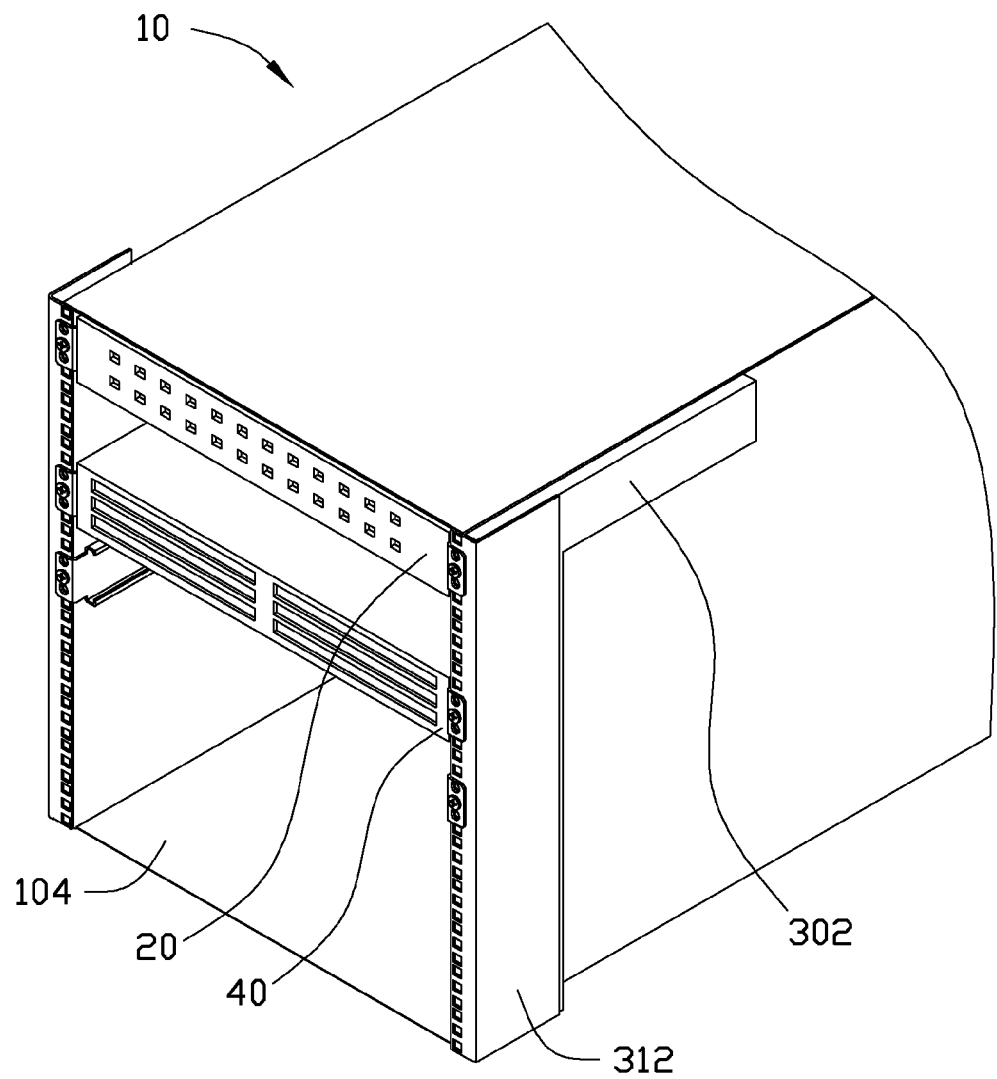
FIG. 2 is an assembled view of the sever rack of FIG. 1

Referring to FIGS. 1 and 2, a server rack 10, according to an embodiment, includes a main body 100, three pairs of rails 200, and a pair of air guiding members 300.

The main body 100 is substantially a hollow cuboid framework and includes an upper plate 116, a lower plate 118, and a pair of sidewalls 102. The upper plate 116 is substantially parallel to the lower plate 118. The sidewalls 102 are substantially parallel to each other and perpendicularly connect two edges of each of the upper plate 116 and the lower plate 118 respectively. The upper plate 116, the lower plate 118, and the pair of sidewalls 102 cooperatively define an inlet 104 at a side thereof and an outlet (not shown) at the other side thereof. The outlet communicates with the inlet 104. Each sidewall 102 includes a first flange 112 bent outward from the inlet 104 about 90 degrees. Each first flange 112 defines a number of first through holes 114. The first flanges 112 are an elongated stripe. The first through holes 114 in each first flange 112 are arranged in a line that is substantially parallel to the lengthwise direction of the corresponding first flange 112. Each sidewall 102 also defines an air hole 110. The air holes 110 are substantially rectangular and aligned with each other. The lengthwise direction of the air holes 110 is substantially parallel to the upper plate 116 and the lower plate 118. In this embodiment, the number of the first through holes 114 in each first flange 112 is thirty-six.

Each rail 200 defines a sliding groove (not labeled) therein and includes a second flange 202 bent outward from an end of the sliding groove about 90 degrees. Each second flange 202 defines a number of second through holes 204, corresponding to a portion of the first through holes 114. In this embodiment, the number of the second through holes 204 in each second flange 202 is three.

Each air guiding member 300 includes a cover body 310 and an assembly sheet 312. Each cover body 310 is substantially an L-shaped cover and includes a first section 302 and a second section 304. Each first section 302 is configured for covering a corresponding air hole 110. Each second section 304 is configured for connecting a corresponding first flange 112. Each cover body 310 defines an air collection opening 314 in the second section 304 thereof, corresponding to the first flange 112 in shape and size. Each assembly sheet 312 includes a third flange 306 and a fourth flange 316 that is perpendicularly connected to the third flange 306. The third flange 306 defines a number of third through holes 308, corresponding to the first through holes 114 of a corresponding first flange 112.

In assembly, the cover bodies 310 are attached to the outer surfaces of the sidewalls 102 respectively such that the first sections 302 cover the air hole 110 and the first flanges 112 seal the air collection openings 314. The assembly sheets 312 are attached to the main body 100 and the respective cover bodies 310. The third flanges 306 contact the respective first flanges 112. The third through holes 308 in each third flange 306 respectively align with the first through holes 114 of the corresponding first flange 112. A number of screws 30 are inserted into a portion of the second through holes 204, the third through holes 308 corresponding to the portion of the second through holes 204, the first through holes 114 corresponding to the portion of the second through hole 204, such that the rails 200 and the air guiding members 300 are secured on the sidewalls 102. Thus, the fourth flanges 316 push the respective cover bodies 310 to the respective sidewalls 102.

The tree pairs of rails 200 are attached to the inner surfaces of the sidewalls 102 and arranged along a direction substantially parallel to the upper plate 116 and the lower plate 118. The second flanges 202 contact the corresponding third flanges 306. The second through holes 204 in each second flange 202 align with the corresponding first and third through holes 114, 308. The rails 200 in each pair align with each other and cooperatively define a channel 106 in the main body 100. One of the three channels 106 defined by the three pairs of rails 200 communicates with the air hole 110 and is configured for receiving a switch 20. The other two channels 106 are configured for receiving two server modules 40. The switch 20 has a first front panel 22. The first front panel 22 defines a number of network interfaces 24. The server modules 40 include a second front panel 42. The second front panel 42 defines a number of heat dissipation slots 44. Thus, cooling air (not shown) can be directed into the server modules 40 via the heat dissipation slots 44. In addition, the cool air can be directed through the second through holes 204, the third through holes 308, the first though holes 114, the air collection openings 314 and the air holes 110 to cool the switch 20.

The number and the arrangement of the first through holes 114 in each first flange 112 are not limited to this embodiment but can be set depending on demands. The configuration of the air holes 110 is not limited to this embodiment too but can be changed depending on demands.

The number and the arrangement of the second through holes 204 can be changed depending on demands too. In other embodiments, the rails 200 can be attached to the sidewalls 102 by other means, and the second flange 202 and the second through holes 204 can be omitted.

The number and arrangement of the third through holes can be changed in other embodiments depending on demands. Further, in other embodiments, other fasteners can be employed instead of the screws 30.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A server rack comprising:
a main body comprising a pair of opposite sidewalls and defining an inlet at a side of the sidewalls, each sidewall comprising a first flange bent outward from the inlet, each sidewall defining an air hole, the first flange defining a number of first through holes;
a pair of rails received in the main body and attached to the sidewalls, the rails cooperatively defining a channel in the main body, the channel communicating with the air holes and being configured for receiving a switch; and
a pair of air guiding members positioned on the sidewalls, each air guiding member comprising a first section and a second section connected to the first section, each first section being positioned outside the main body and covering a corresponding air hole, one end of each second section being positioned within an intersecting corner between a corresponding sidewall and a corresponding first flange, and contacting the corresponding first flange, each air guiding member defining an air collection opening in the second section thereof, each air collection opening being covered by the corresponding first flange and in communication with the first through holes of the corresponding first flange and the corresponding air hole.

2. The server rack of claim 1, wherein each first flange is an elongated stripe, the first through holes in each first flange are arranged in a line that is substantially parallel to a lengthwise direction of each first flange.

3. The server rack of claim 1, further comprising an upper plate and a lower plate, the sidewalls perpendicularly connecting two edges of each of the upper plate and the lower plate.

4. The server rack of claim 3, wherein the air holes are rectangular, a lengthwise direction of each air hole is substantially parallel to the upper plate and the lower plate.

5. The server rack of claim 1, wherein each air guiding member comprises a cover body and an assembly sheet, the cover body comprises one of the first sections and one of the second sections, the assembly sheet comprises a second flange and a third flange perpendicularly connected to the second flange, the second flange contacts a correspond first flange and defines a number of second through holes, corresponding to the first through holes of the corresponding first flange, the third flange contacts the second section.

6. The server rack of claim 5, wherein the cover body is substantially an L-shaped cover.

7. The server rack of claim 5, wherein each rail comprises a fourth flange, each fourth flange contacts a corresponding second flange and defines a number of third through holes that are aligned with a portion of the second through holes of the corresponding second flange.

8. The server rack of claim 7, further comprising a number of fasteners, each of the fasteners inserted into a corresponding one of the first through holes, a corresponding one of the second through holes, and a corresponding one of the third through holes.

9. The server rack of claim 1, further comprising a plurality of pair of another rails received in the main body and attached to the sidewalls for receiving a plurality of server modules respectively.

* * * * *